United States Patent
Morstein et al.

(10) Patent No.: US 6,926,811 B2
(45) Date of Patent: Aug. 9, 2005

(54) ARC-COATING PROCESS WITH ROTATING CATHODES

(75) Inventors: Marcus Morstein, Grenchen (CH); Tibor Cselle, Grenchen (CH); Pavel Holubar, Sumperk (CZ); Mojmir Jilek, Sumperk (CZ); Peter Blösch, Biel (CH)

(73) Assignee: PIVOT a.s., Novy Malin (CZ)

( * ) Notice: Subject to any disclaimer, the term of this patent is extended or adjusted under 35 U.S.C. 154(b) by 113 days.

(21) Appl. No.: 10/419,992

(22) Filed: Apr. 22, 2003

(65) Prior Publication Data

US 2004/0007455 A1 Jan. 15, 2004

(30) Foreign Application Priority Data

Apr. 22, 2002 (EP) ............................................ 02008914

(51) Int. Cl.[7] ................................................ C23C 14/34
(52) U.S. Cl. ................................................ 204/192.38
(58) Field of Search ...................... 204/192.38, 298.16, 204/298.41

(56) References Cited

U.S. PATENT DOCUMENTS

| | | | |
|---|---|---|---|
| 4,179,351 A | | 12/1979 | Hawton, Jr. et al. ........ 204/248 |
| 4,673,477 A | * | 6/1987 | Ramalingam et al. . 204/192.38 |
| 4,849,088 A | * | 7/1989 | Veltrop et al. ......... 204/298.41 |
| 5,026,466 A | * | 6/1991 | Wesemeyer et al. ... 204/192.38 |
| 6,103,074 A | | 8/2000 | Khominich ............ 204/192.38 |
| 2002/0007796 A1 | | 1/2002 | Gorokhovsky |

* cited by examiner

Primary Examiner—Steven H VerSteeg
(74) Attorney, Agent, or Firm—Venable LLP; Stuart I. Smith

(57) ABSTRACT

A method is provided for coating objects in a vacuum chamber in which a physical vapor deposition (PVD) can be carried out. The chamber has at least one anode means, at least one cathode and at least one magnetic field source. An arc can be ignited between the at least one anode means and the at least one cathode, and the cathode separates material. The at least one magnetic field can be turned relative to the at least one cathode and the objects to be coated are arranged in the chamber. The magnetic field is turned before the beginning of the coating process so that the separated material does not coat the objects to be coated in the coating process. The arc for the physical deposition process is produced by means of at least two cathodes, said cathodes are constructed as substantially cylindrical tubular cathodes and the at least one magnetic field source is constructed as a permanent or coil magnet arranged in the tubular cathodes and the tubular-cathodes turn about their cylinder axis during the coating process.

21 Claims, 7 Drawing Sheets

ARC-COATING PROCESS WITH ROTATING CATHODES

FIELD OF THE INVENTION

The present invention relates to a method for coating surfaces of objects (substrates) by Physical Vapour Deposition (PVD) using an arc. In detail the invention relates to a method for coating such objects in a vacuum chamber comprising at least one anode means, at least one cathode and at least one magnetic field source.

The invention further relates to an apparatus for such a method.

BACKGROUND OF THE INVENTION

Description of the Prior Art

DE-A-43 29 155 has already disclosed a method of holding the arc on the target, i.e., on the cathode, by means of a magnetic field running approximately parallel to the surface of a PVD target and thereby achieving improved, namely uniform, evaporation of the target material.

WO-A-00/56946 discloses a generic apparatus with which material can be applied to an object by means of a physical method in vacuum for the purposes of coating an object (substrate) or a plurality of substrates. Here the objects (substrates) are located in a vacuum chamber, as described therein. In this patent application reference is made to WO-A-00/56946 and the application WO-A-00/56946 is included in its full extent in this application text.

In the coating chamber there are arranged one or several substantially cylindrical cathodes and the deposition of material is controlled with the aid of magnetic sources. The magnetic sources are preferably arranged in the cathodes and the cathode is turned relative to the magnetic field source or the magnetic field source is turned relative to the cathode to achieve uniform removal of material from the target. This material is then deposited on the substrates.

In such a chamber substrates are usually placed on a rotary table and successively coated as the table is turned. According to the prior art the cathode is placed, for example, at the centre of the rotary table so that several objects can be coated in one chamber. However, it has already been disclosed in WO-A-00/56946 that the cathode—in the case described therein, two cathodes—can rather be arranged at the edge of the vacuum chamber with the rotary table remaining at the centre of the chamber.

For instance, TiN compounds can be used for coating whereby titanium is removed from a metallic titanium target (cathode) in a nitrogen atmosphere by means of an arc and the TiN thus formed is applied to the object (substrate) to be coated by means of a voltage difference between the cathode and the substrate.

Usually here the actual coating process is preceded by etching processes. First the chamber is cleaned using an inert gas atmosphere, according to the known prior art for coating methods, wherein argon can be used as the inert gas for example. In such a process, metallic titanium, not TiN, is separated from the cathode. However, since this process is for cleaning and not for coating the substrate, it is desirable if at least part of the metallic titanium thus separated does not reach the substrate.

There is also the problem that at the beginning of the coating process larger particles are released from the target (so-called droplets). These larger particles also should not reach the substrate.

In addition, when objects are coated in such a chamber or in another chamber according to the prior art, the problem of non-uniform coating thickness arises. This is because during such coating processes the efficiency of the deposition apparatus (magnetic source and cathode) differs in relation to the height. Without special measures the coating thickness at the centre, relative to the height, is therefore greater than that at the top and at the bottom.

SUMMARY OF THE INVENTION

Object of the Invention

It is thus firstly the object of the invention to provide a coating method in which the problem of larger particles (droplets) and the previous contamination at the beginning of the deposition process can be taken into account.

DESCRIPTION OF THE INVENTION

The invention achieves the object by a method for coating objects in a vacuum chamber in which a physical vapour deposition (PVD) can be carried out, wherein the chamber comprises at least one anode means, at least one cathode and at least one magnetic field source, wherein an arc can be ignited between the at least one anode means and the at least one cathode, the at least one magnetic field can be turned relative to the at least one cathode and the objects to be coated are arranged in the chamber, further comprising the step of the magnetic field being turned before the beginning of the coating process so that the separated material does not coat the objects to be coated in the coating process. The measures of the invention firstly have the result a cleaning process can be carried out in the coating chamber where the particle size is optimised and any contaminant particles (e.g. carbon from acetylene) are deposited, preferably at a wall opposite the substrates, relative to the targets.

With the controlled modification of the magnetic field the coating thickness can be controlled and improved in the constancy.

In an embodiment of the invention, the vertical distribution of the coating thickness can be controlled, wherein preferably a uniform layer thickness is selected. Here the magnets are moved from the top to the bottom or conversely in order to be able to utilise the entire height of the chamber when the substrates are coated. This takes place preferably by the deposition in the upper and lower regions being accomplished as accurately as possible in the direction of the object to be coated whereas in the central region in which without the measures of the invention, a thicker coating would be achieved, the direction of deposition is turned by approximately 5° to 20°, preferably by approximately 10°, and so the coating rate and thus the coating thickness are effectively reduced for the same time unit.

The aforesaid procedural steps and those claimed and described in the following examples of embodiment to be used according to the invention and the relevant elements are not subject to any special exclusion conditions in terms of their size, design, material usage and technical conception so that the selection criteria known in the particular field of application can be applied without restriction.

According to a second aspect of the invention an apparatus is defined for coating objects by PVD are method, wherein said apparatus is equipped by a magnetic system prepared to change the layer growth rate, the magnetic system is prepared so that the layer growth rate can be controlled, the PVD arc technology is applied on cylindrical cathode system, the magnetic field is created by electromagnetic coil or permanent magnetic system or both of them, and the magnetic field modification can move the arc track from the centre to the side of the cathode surface. Alternatively, the the magnetic field modification can move the centre of the arc track; around the cylindrical cathode.

Further details, features and advantages of the object of the invention are obtained from the following description of the relevant drawings wherein, for example, a method according to the present invention is explained.

DETAILED DESCRIPTION OF THE EMBODIMENTS OF THE INVENTION

Figure 1:
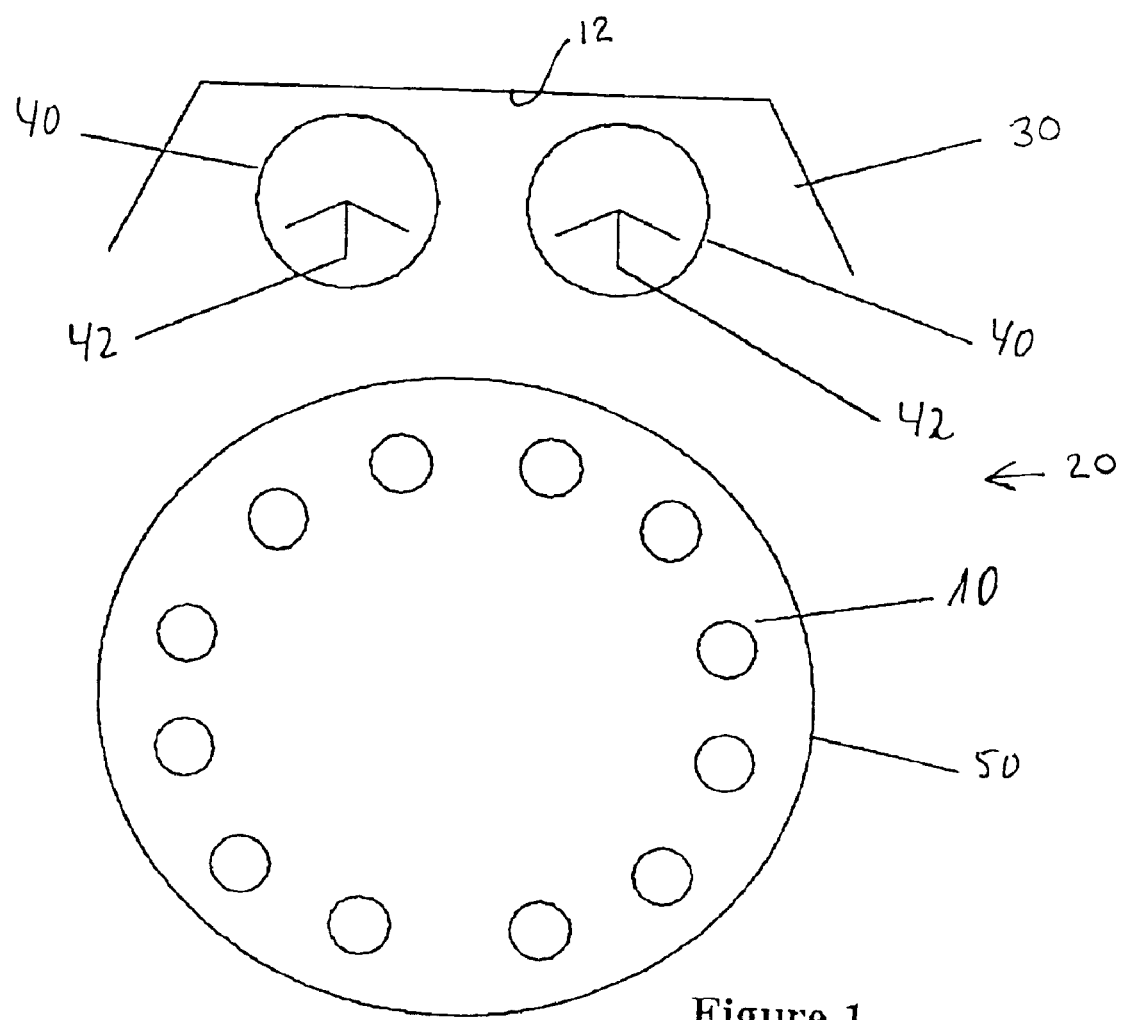
FIG. 1 is a schematic diagram of the chamber with two cathodes and magnetic field sources arranged therein in the rest position.
Figure 2:
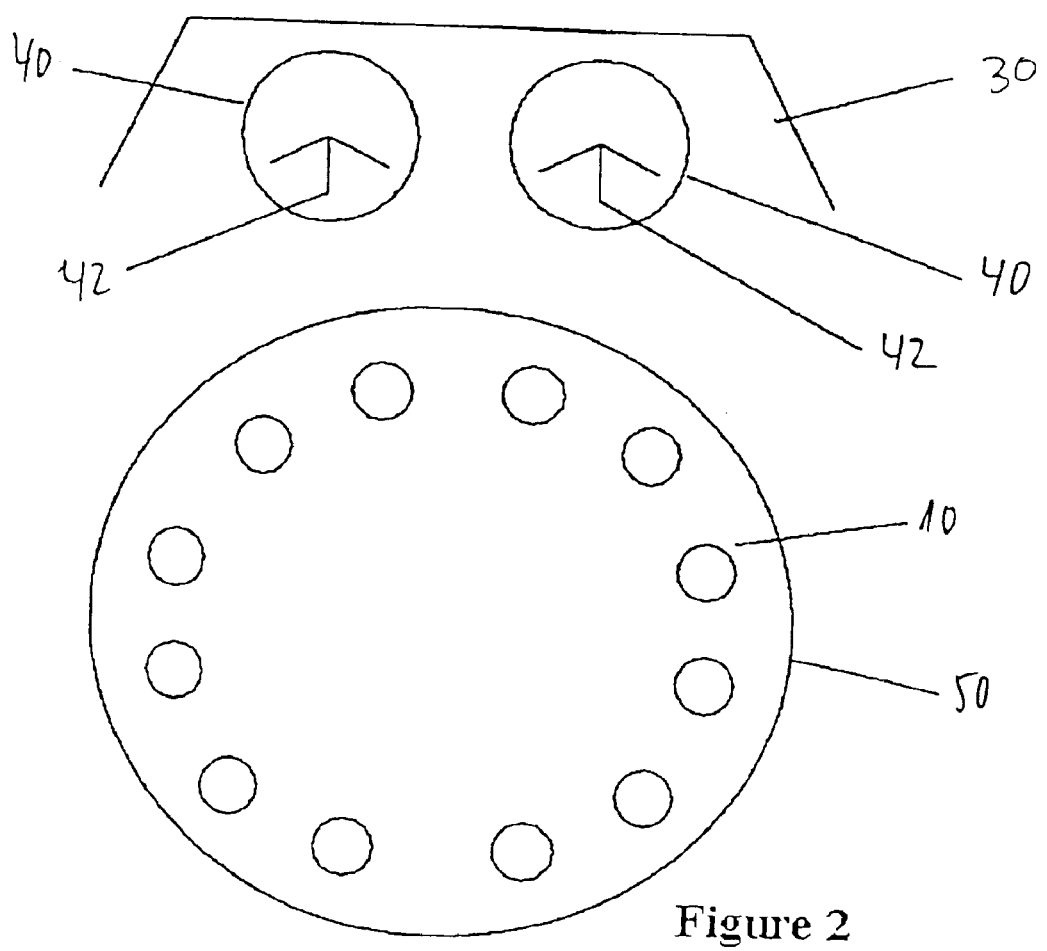
FIG. 2 is a schematic diagram of the magnetic source alignment in the normal position.
Figure 3:
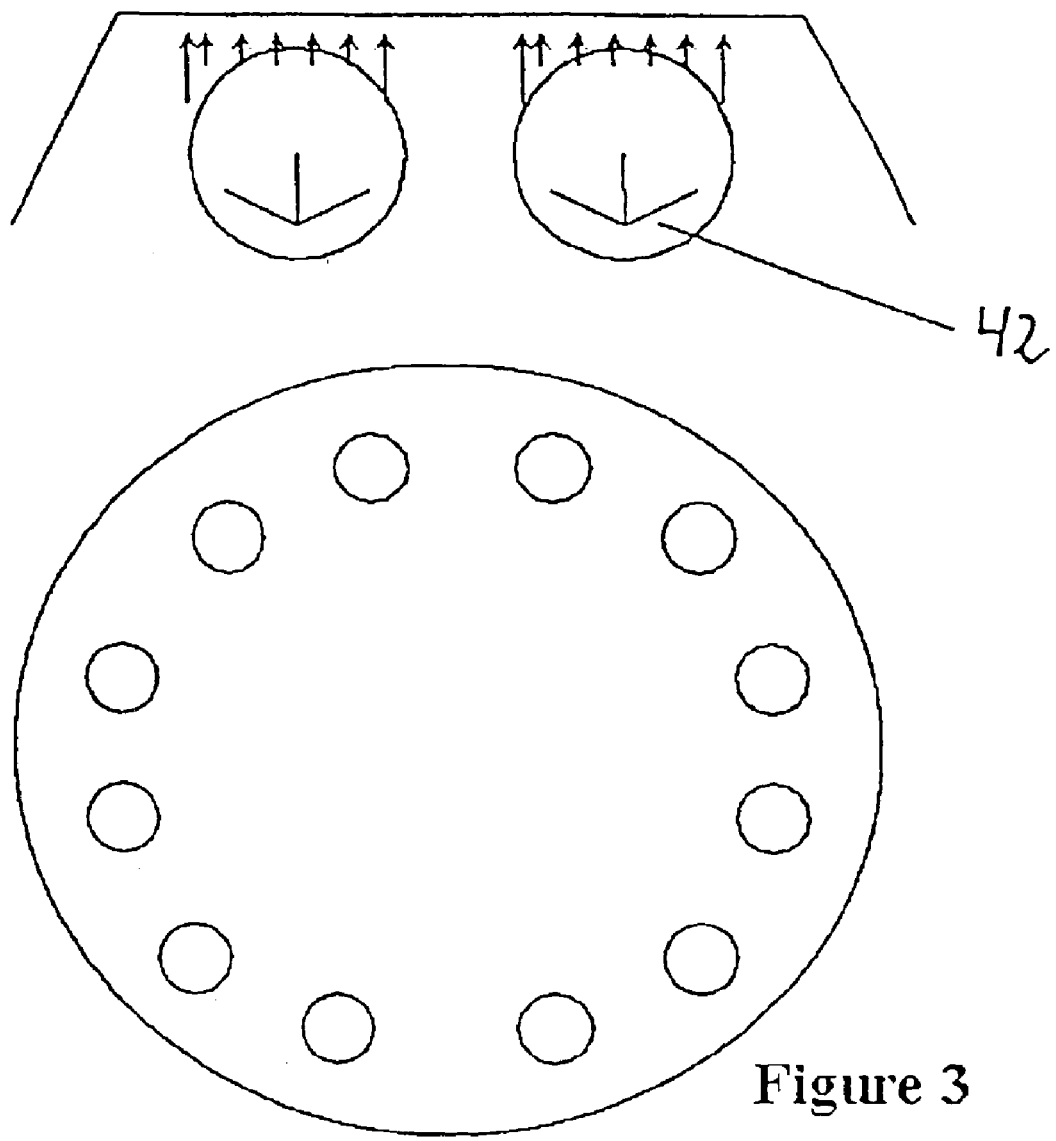
FIG. 3 is a schematic diagram of the magnetic source alignment in the cleaning position and/or before the beginning of coating if droplets are first separated.
Figure 4:
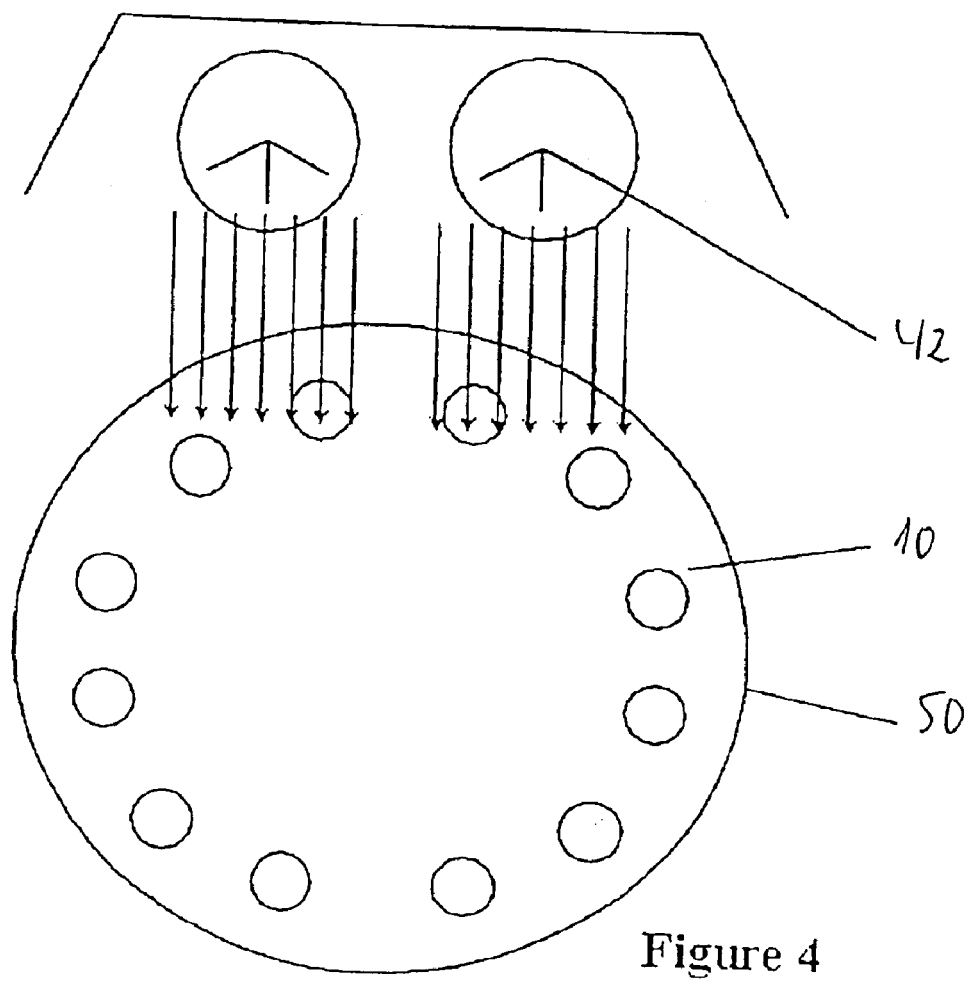
FIG. 4 is a schematic diagram of the magnetic source alignment in the coating position.
Figure 5:
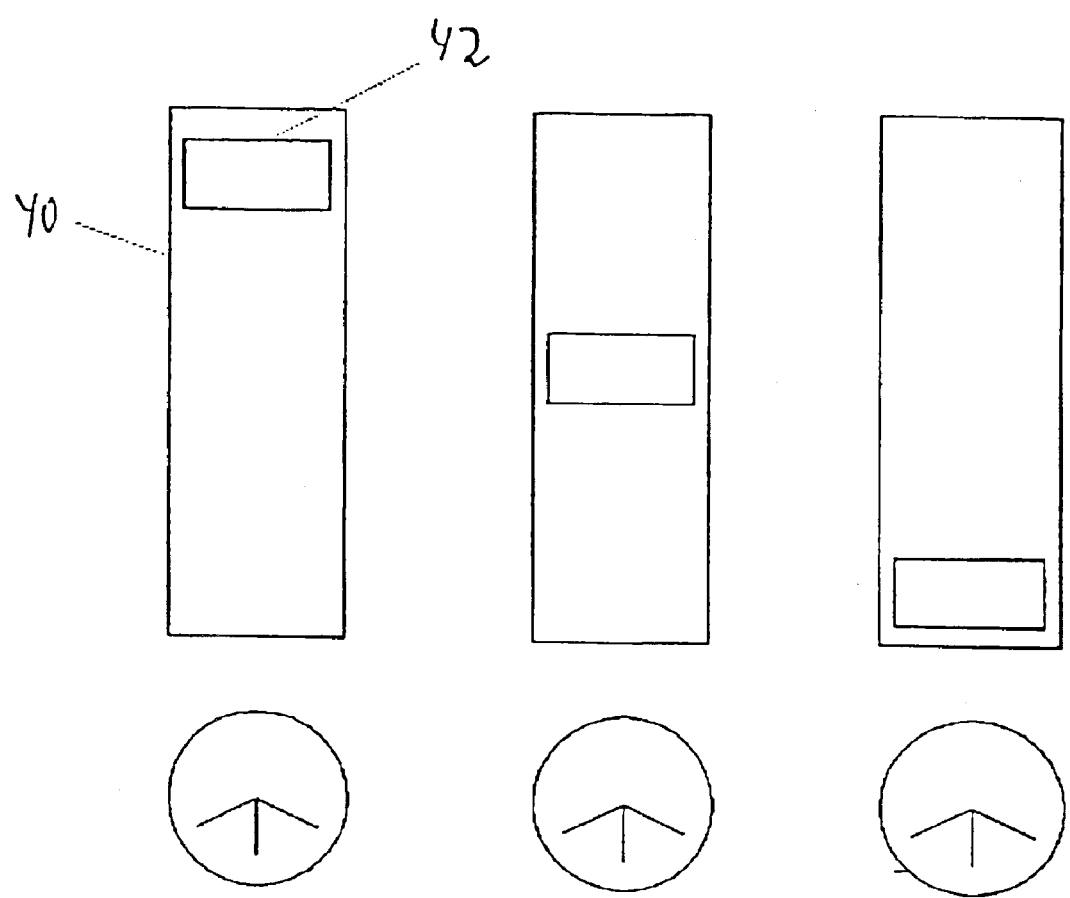
FIG. 5 is a schematic diagram of the upward and downward movement of the magnets in order to coat the substrates over their entire height.
Figure 6:
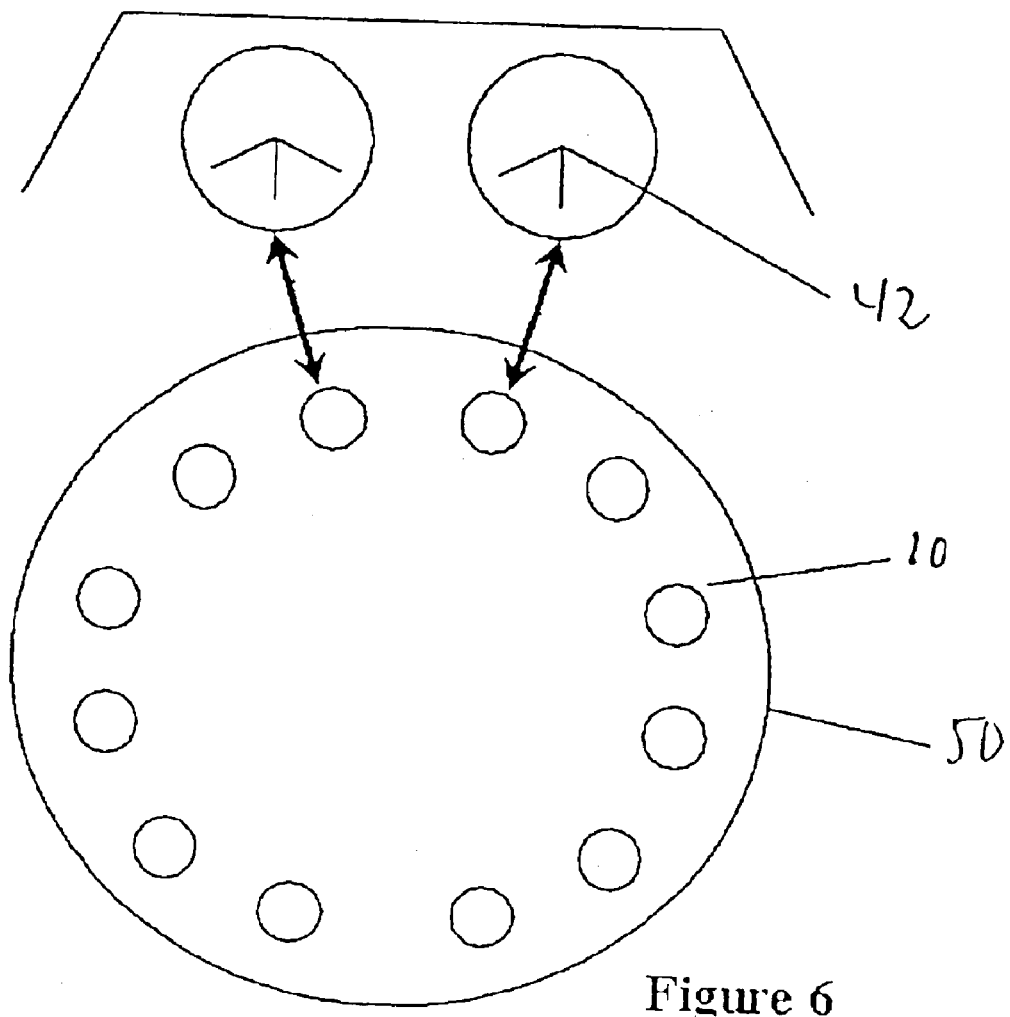
FIG. 6 is a schematic diagram of the magnetic source alignment if the magnets are located at roughly their upper or lower points in relation to their upward and downward movement.
Figure 7:
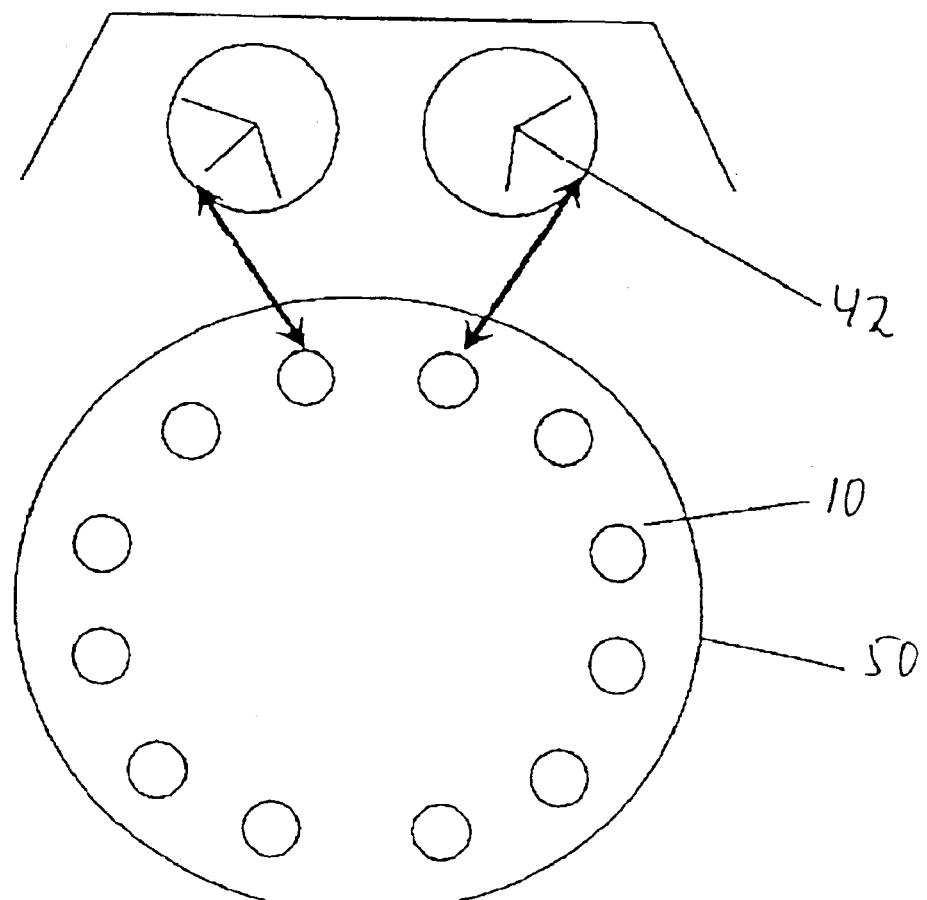
FIG. 7 is a schematic diagram of the magnetic source alignment turned outwards by approximately 45° if the magnets are located at roughly their midpoint in relation to their upward and downward movement.

In a vacuum chamber designated as a whole by 20 in FIG. 1 there is arranged a rotary table 50 with objects (substrates) 10 located thereon approximately at the centre of the chamber. The substrates are to be coated in a PVD method by applying an electric field between an anode 30 and the cathodes 40, whereby—in the present example of embodiment using an ignition device—an arc is generated in the direction of the cathodes 40 whereby material is released from the cathodes and is accelerated towards the substrates 10 by a low-voltage dc voltage between the cathode 40 and the substrates 10. As described in WO-A-00/56946, the cathodes 40 are approximately cylindrical, wherein the cylinder is constructed such that it is approximately vertical in the vacuum chamber 20 and the base surface of the cathode cylinder can also be elliptical. During the coating process the cathodes 40 are cooled by flowing water. In the cathodes 40 there are arranged magnetic field sources 42 which, as in WO-A-00/56946, are designed so that they move the arc spot onto the cathodes 40 approximately where the magnetic field is strongest parallel to the cathode surface.

For the coating process the magnets 42 are now moved upwards and downwards inside the cathode 40 whereby the arc spot and thus the source of the particle flow to the cathodes 40 migrates up and down. Since for geometric reasons an effectively thicker layer would be deposited on the substrate without the measures according to the invention, in the central height positions the magnetic field and thus the particle current source is now turned by approximately 45° from the axis between the appropriate target and the substrate, thus forcing the particle flow to have an effectively longer path compared with that in the upper and lower height position of the magnetic source 42 inside the target (cathode 40). In the example of embodiment the profile is selected in accordance with a cosine-function. In this case the largest turning of the magnetic field source 42 from the axis between the target 40 and the substrate 10 is selected for the smallest deflection from the centre.

Before beginning the actual coating process in the present example of embodiment the magnetic field source 42 is turned by approximately 180° from the axis between the target and the substrate whereby the particles released from the target impact on the chamber wall 12. This additional measure has the effect that contaminants on the target as a result of previous coating processes can be initially evaporated. This measure also has the effect that the larger droplets formed at the beginning of an evaporation effect do not reach the substrate but are also deposited on the rear wall of the chamber. After this cleaning and starting process the magnetic field source 42 is then turned in the direction of the axis between the target 40 and the substrate 10 (0°) and the process described above begins.

It will be obvious to the person skilled in the art that the measure of the invention to control the coating thickness in terms of height by turning the magnetic field source 42, can also be applied advantageously when, for whatsoever reasons, the measure of turning the magnetic field source 42 before the beginning of the coating process so that the separated particles impact on a chamber wall turned away from the objects to be coated is not used.

What is claimed is:

1. A method for coating objects
   in a vacuum chamber in which a physical vapour deposition (PVD) can be carried out, wherein
   the chamber comprises at least one anode means, at least one cathode and at least one magnetic field source, wherein an arc can be ignited between the at least one anode means and the at least one cathode, and wherein said cathode separates material,
   the at least one magnetic field can be turned relative to the at least one cathode and
   the objects to be coated are arranged in the chamber,
   further comprising the step of the magnetic field being turned before the beginning of the coating process so that the separated material does not coat the objects to be coated in the coating process,
   wherein the arc for the physical deposition process is produced by means of at least two cathodes, said cathodes are constructed as substantially cylindrical tubular cathodes and the at least one magnetic field source is constructed as a permanent or coil magnet arranged in the tubular cathodes and wherein said tubular-cathodes turn about their cylinder axis during the coating process.

2. The method according to claim 1, wherein said anode means is realized by the housing of said chamber.

3. The method according to claim 1, wherein the arc for the physical deposition process is driven between the chamber wall as the anode means and at least one of said cathodes.

4. The method according to claim 1, wherein the arc for the physical deposition process is driven between a rod or plate anode arranged in the chamber as the anode means and the at least one of said cathodes.

5. The method according to claim 1, wherein the magnetic field source is turned before the beginning of the coating process such that the separated particles impact on a chamber wall facing away from the objects to be coated.

6. The method according to claim 1, wherein the direction of deposition before the beginning of the coating process is turned by approximately 150° to 180° relative to the direction of the objects to be coated.

7. The method according to claim 6, wherein the direction of deposition before the beginning of the coating process is turned by approximately 180° relative to the direction of the objects to be coated.

8. The method according to claim 1, wherein the method comprises steps for successively carrying out the coating in relation to the height, where the magnetic field source is moved upwards and downwards and the magnetic field source is turned relative to the cathode during the upward and downward movement and the coating rate is thus changed with respect to height.

9. The method according to claim 8, wherein in the upper region and in the lower region of the deposition process the magnetic field source takes on a direction in which the coating rate is greater than in the central region.

10. The method according to claim 9, wherein in the central region the magnetic field source is turned outwards by approximately 45° from the direction between the cathode and the object to be coated.

11. A method for coating objects in a vacuum chamber in which a physical vapour deposition (PVD) can be carried out, wherein the chamber comprises at least one anode means, at least one cathode and at least one magnetic field source, wherein an arc can be ignited between the at least one anode means and the at least one cathode, and wherein said cathode separates material, the at least one magnetic field can be turned relative to the at least one cathode and the objects to be coated are arranged in the chamber, further comprising the step of the magnetic field being turned before the beginning of the coating process so that the separated material does not coat the objects to be coated in the coating process, wherein the direction of deposition before the beginning of the coating process is turned by approximately 150° to 180° relative to the direction of the objects to be coated.

12. The method according to claim 11, wherein said anode means is realized by the housing of said chamber.

13. The method according to claim 11, wherein the arc for the physical deposition process is driven between the chamber wall as the anode means and at least one cathode.

14. The method according to claim 11, wherein the arc for the physical deposition process is driven between a rod or plate anode arranged in the chamber as the anode means and the at least one cathode.

15. A method for coating objects in a vacuum chamber in which a physical vapour deposition (PVD) can be carried out, wherein the chamber comprises at least one anode means, at least one cathode and at least one magnetic field source, wherein an arc can be ignited between the at least one anode means and the at least one cathode, and wherein said cathode separates material, the at least one magnetic field can be turned relative to the at least one cathode and the objects to be coated are arranged in the chamber, further comprising the step of the magnetic field being turned before the beginning of the coating process so that the separated material does not coat the objects to be coated in the coating process, wherein the method comprises steps for successively carrying out the coating in relation to the height, where the magnetic field source is moved upwards and downwards and the magnetic field source is turned relative to the cathode during the upward and downward movement and the coating rate is thus changed with respect to height, and wherein in the upper region and in the lower region of the deposition process the magnetic field source takes on a direction in which the coating rate is greater than in the central region.

16. The method according to claim 15, wherein said anode means is realized by the housing of said chamber.

17. The method according to claim 15, wherein the arc for the physical deposition process is driven between the chamber wall as the anode means and at least one cathode.

18. The method according to claim 15, wherein the arc for the physical deposition process is driven between a rod or plate anode arranged in the chamber as the anode means and the at least one cathode.

19. The method according to claim 15, wherein the direction of deposition before the beginning of the coating process is turned by approximately 150° to 180° relative to the direction of the objects to be coated.

20. The method according to claim 15, wherein in the central region the magnetic field source is turned outwards by approximately 45° from the direction between the cathode and the object to be coated.

21. The method according to claim 15, wherein the direction of deposition before the beginning of the coating process is turned by approximately 180° relative to the direction of the objects to be coated.

* * * * *